(12) United States Patent
Swanson

(10) Patent No.: US 9,577,633 B1
(45) Date of Patent: Feb. 21, 2017

(54) CAPACITIVE CHARGE TRIGGERED PROXIMITY SWITCH FOR USE WITH TIME DOMAIN SWITCHED INERTIAL SENSORS

(71) Applicant: SPAWAR Systems Center Pacific, San Diego, CA (US)

(72) Inventor: Paul David Swanson, Santee, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 15/185,495

(22) Filed: Jun. 17, 2016

(51) Int. Cl.
*H03K 17/96* (2006.01)

(52) U.S. Cl.
CPC . *H03K 17/962* (2013.01); *H03K 2217/960725* (2013.01)

(58) Field of Classification Search
CPC .................. G06F 17/15; H03K 17/962; H03K 2217/960725
USPC ... 327/517, 516, 306, 509; 377/20; 361/179, 361/181; 73/514.35, 504.12; 324/76.11; 331/154, 165
See application file for complete search history.

(56) References Cited

U.S. PATENT DOCUMENTS

| 5,291,534 | A | * | 3/1994 | Sakurai | G01D 3/0365 327/509 |
|---|---|---|---|---|---|
| 8,427,249 | B1 | * | 4/2013 | Swanson | H03H 9/02433 310/348 |
| 8,650,955 | B2 | | 2/2014 | Swanson et al. | |
| 8,689,631 | B1 | | 4/2014 | Tally et al. | |
| 8,952,838 | B2 | | 2/2015 | Waters et al. | |
| 8,991,250 | B2 | | 3/2015 | Waters et al. | |
| 9,103,673 | B2 | | 8/2015 | Swanson et al. | |
| 9,157,814 | B2 | | 10/2015 | Swanson et al. | |
| 2012/0326700 | A1 | * | 12/2012 | Swanson | G01P 15/097 324/76.11 |
| 2014/0047918 | A1 | * | 2/2014 | Swanson | G01C 19/56 73/504.12 |

(Continued)

*Primary Examiner* — Lincoln Donovan
*Assistant Examiner* — Thomas Skibinski
(74) *Attorney, Agent, or Firm* — SPAWAR Systems Center Pacific; Kyle Eppele; J. Eric Anderson

(57) ABSTRACT

A DC voltage supply provides voltage. A time domain switched inertial capacitive sensor provides a thresholding variable capacitance based on the voltage. A second voltage supply provides a voltage, $V_{DD}$. A logic inverter circuit has a logic inverter input and a logic inverter output, wherein the logic inverter circuit is supplied with $V_{DD}$. A third voltage supply provides a second voltage, $V_{CC}$. A time domain switched inertial capacitive sensor and the capacitor are arranged as a capacitive voltage divider between the DC voltage supply and the logic inverter circuit and so as to provide an input voltage $V_{in}$ as an input signal to the logic inverter circuit. The logic inverter circuit outputs an output voltage, $V_{out}$, based on the input signal. The switch provides a bias voltage, $V_{bias}$, to the logic inverter circuit based on $V_{out}$ such that the input signal is based on $V_{in}$ and $V_{bias}$.

14 Claims, 9 Drawing Sheets

(56) References Cited

U.S. PATENT DOCUMENTS

| | | | |
|---|---|---|---|
| 2014/0062567 A1* | 3/2014 | Waters | G01P 15/097 327/306 |
| 2014/0305213 A1* | 10/2014 | Swanson | G01P 15/097 73/514.35 |
| 2016/0299873 A1* | 10/2016 | Tally | G06F 17/15 |

* cited by examiner

CAPACITIVE CHARGE TRIGGERED PROXIMITY SWITCH FOR USE WITH TIME DOMAIN SWITCHED INERTIAL SENSORS

FEDERALLY-SPONSORED RESEARCH AND DEVELOPMENT

The United States Government has ownership rights in this invention. Licensing inquiries may be directed to Office of Research and Technical Applications, Space and Naval Warfare Systems Center, Pacific, Code 72120, San Diego, Calif., 92152; telephone (619)553-5118; email: ssc_pac_t2@navy.mil. Reference Navy Case No. 102761.

BACKGROUND OF THE INVENTION

Embodiments of the invention relate to time domain switched inertial sensors (TDSIS). TDSIS provide a way to measure inertial force. Instead of measuring the distance a mass on a spring is displaced by an inertial force, the mass on a spring is intentionally brought into harmonic oscillation, and the time intervals are measured between when the mass passes known fixed locations. The displacement of the entire harmonic oscillation (caused by the inertial force) can then be determined by curve fitting the time intervals into the known time-space relationships of the harmonic oscillator.

SUMMARY OF THE INVENTION

An aspect of the present invention is drawn to a proximity switch circuit comprising a DC voltage supply, a time domain switched inertial capacitive sensor, a capacitor, a second voltage supply, a logic inverter circuit, a third voltage supply and a switch. The DC voltage supply is operable to provide a DC voltage. The time domain switched inertial capacitive sensor is arranged to provide a thresholding variable capacitance based on the DC voltage. The second voltage supply is operable to provide a voltage, $V_{DD}$. The logic inverter circuit has a logic inverter input and a logic inverter output, wherein the logic inverter circuit is supplied with $V_{DD}$. The third voltage supply is operable to provide a second voltage, $V_{CC}$. The time domain switched inertial capacitive sensor and the capacitor are arranged as a capacitive voltage divider between the DC voltage supply and the logic inverter circuit and so as to provide an input voltage $V_{in}$, based on the DC voltage as an input signal to the logic inverter circuit. The logic inverter circuit is operable to output an output voltage, $V_{out}$, based on the input signal. The logic inverter circuit is operable to output $V_{out}$ as a digital high signal in a first state and a digital low signal in a second state. The logic inverter circuit operates in the first state when the input signal is greater than or equal to a predetermined threshold voltage, $V_{th}$. The switch is arranged to provide a bias voltage, $V_{bias}$, to the logic inverter circuit based on $V_{out}$ such that the input signal is based on $V_{in}$ and $V_{bias}$.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Figure 1:
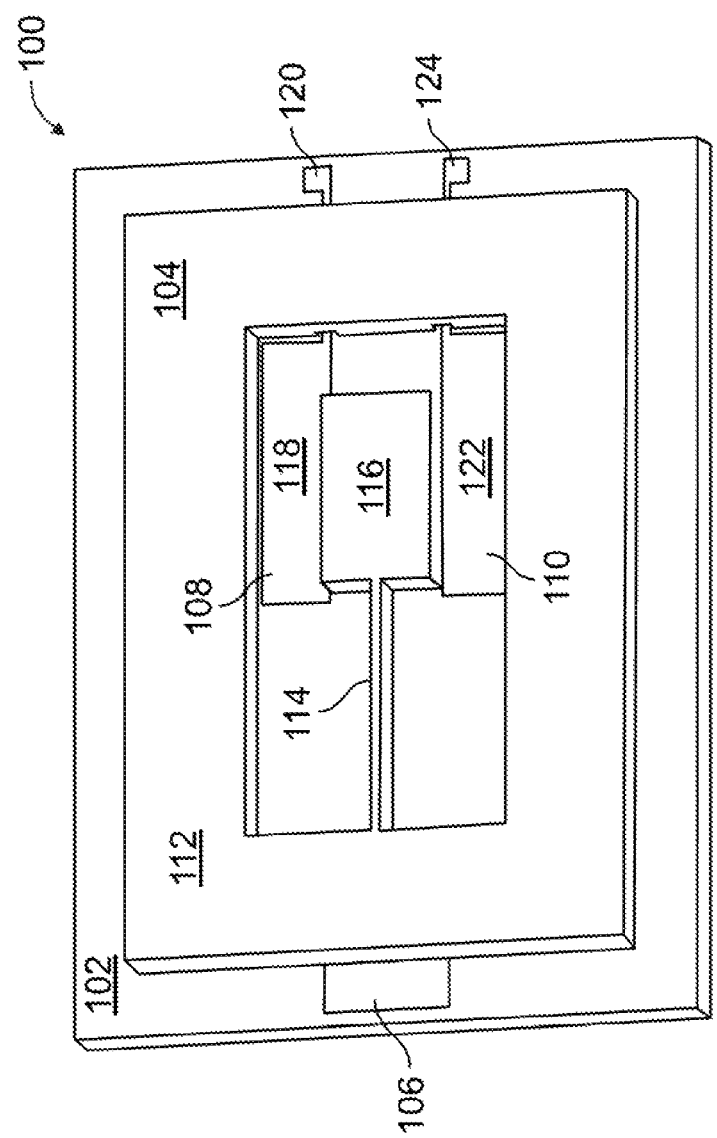
FIG. 1 illustrates a time domain switched inertial capacitive sensor (TDSICS)

FIG. 1 illustrates a time domain switched inertial capacitive sensor (TDSICS). The TDSICS 100 shown in FIG. 1 includes a substrate 102, a proof mask wafer 104, a contact pad 106, an electrode 108 and an electrode 110. Proof mask wafer 104 includes a ring 112, a spring 114 and a proof mass 116. Electrode 108 includes a capacitance pad portion 118 and a contact pad portion 120. Electrode 110 includes a capacitance pad portion 122 and contact pad 124 portion Substrate 102 is the base layer for TDSICS 100 and may be manufactured using any conventional materials typically used for sensors. Proof mask wafer 104, contact pad 106, electrode 108 and electrode 110 may be disposed on substrate 102 using known fabrication methods.

Proof mask wafer 104 may be manufactured by known wafer fabrication techniques. Proof mask wafer 104 may be conventionally etched to create ring 112.

Ring 112 is etched from proof mask wafer 104, and provides a space in which spring 114 is attached. Spring 114 is also attached to proof mass 116.

Electrodes 108 and 110 may be manufactured by any known method, a non-limiting example of which includes deposition.

Contact pad portions 120 and 124 are in electrical communication with contact pad portions 120 and 124. Contact pad portions 120 and 124 provide output voltage from TDSICS 100 to other electrical connections during normal operation. Contact pad portions 120 and 124 may be manufactured by any known method, a non-limiting example of which includes deposition.

Contact pad 106 is in electrical communication with other electrical connections, and provides a voltage to spring 114 and proof mass 116 during normal operation. Contact pad 106 may be manufactured by any known manner, a non-limiting example of which includes deposition.

With reference to FIG. 1, operation of TDSICS 100 starts with a signal sent through contact pad 106 that provides a known, forced harmonic oscillation of proof mass 116. Proof mass 116 begins to oscillate between capacitance pad portions 118 and 122. Depending on the orientation of TDSICS 100, the oscillation can be in any plane within the 3-dimensional space.

The operation of TDSICS 100 will be further described with reference to FIGS. 2-3.

The displacement of an oscillating proof mass without perturbing inertial force and the resulting change of capacitance on two switches will now be described with greater detail with reference to FIG. 2.

Figure 2:
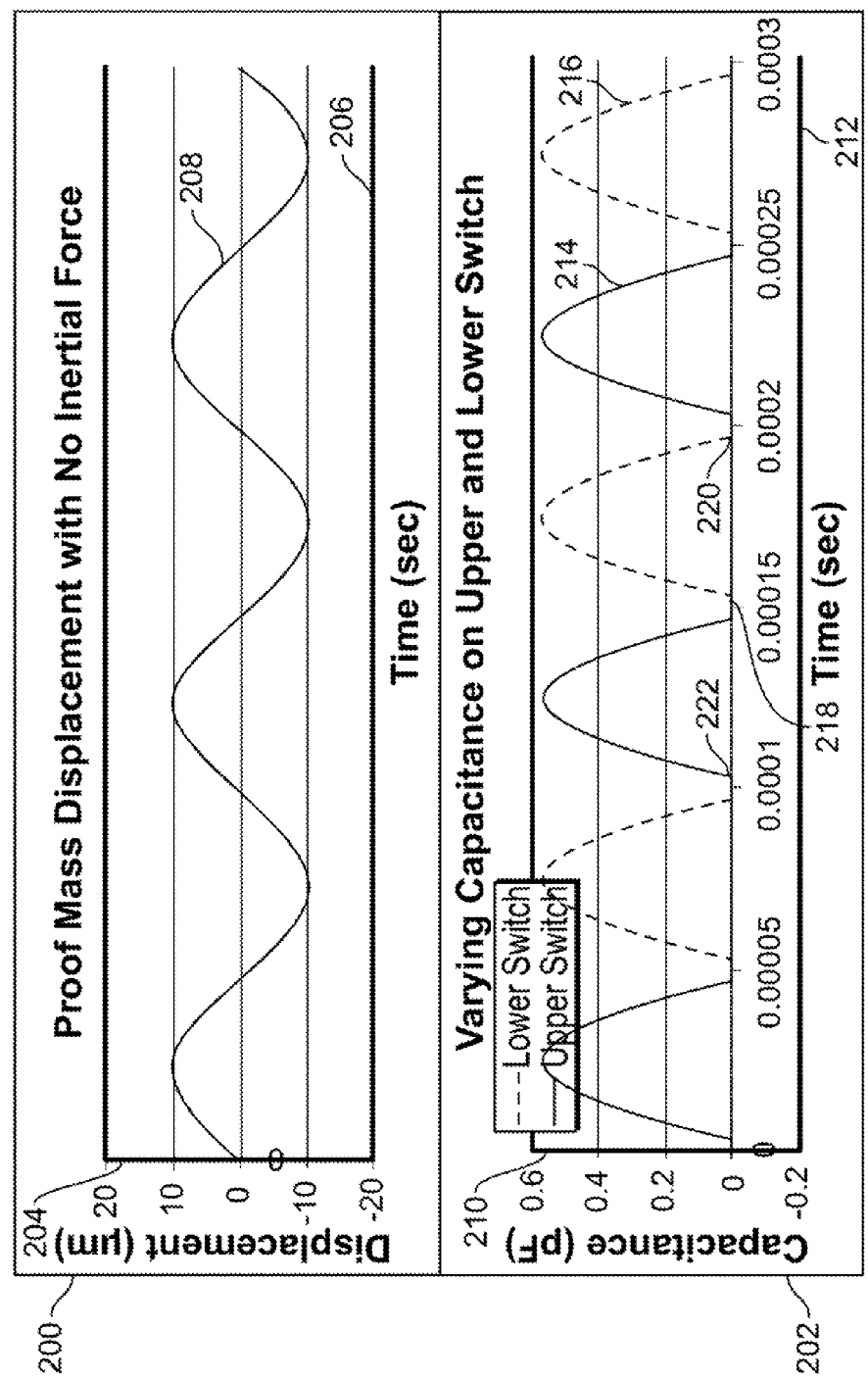
FIG. 2 illustrates a graphical representation of one embodiment of a TDSICS.

FIG. 2 illustrates a graphical representation of the operation of one embodiment of TDSICS 100.

As shown in the figure, a graph 200 includes a y-axis 204, an x-axis 206, and a function 208. A graph 202 includes ay-axis 210, an x-axis 212, a function 214 and a function 216. Functions 214 and 216 include zero-value areas, an example of which is labeled as zero-point area 218. Function 214 further includes inflection points, an example of which is labeled as inflection point 222. Function 216 further includes inflection points, an example of which is labeled as an inflection point 220.

Y-axis 204 represents the displacement of proof mass 116 as it oscillates and x-axis 206 represents the elapsed time. Function 208 represents the displacement of proof mass 116 over time after the forced, harmonic oscillation begins. At zero displacement, proof mass 116 is directly between capacitance pad portions 118 and 122. When no other inertial force acts upon proof mass 116, the displacement of proof mass 116 will follow function 208 and proof mass 116 will travel an equal distance toward, and away from, each of capacitance pad portions 118 and 122.

Y-axis 210 represents the capacitance created with each of capacitance pad portions 118 and 122 as proof mass 116 oscillates between them, and x-axis 212 represents the elapsed time.

Referring back to FIG. 1, when proof mass 116 is traveling toward capacitance pad portion 118 and begins to cover capacitance pad portion 118, parallel portions of proof mass 116 and capacitance pad portion 118 become plates of a capacitor.

Returning to FIG. 2, when proof mass 116 just begins to cover capacitance pad portion 118, function 214 is at inflection point 222 and the capacitance begins to increase. As proof mass continues to cover more of capacitance pad portion 118, the capacitance continues to increase until the capacitance reaches a maximum when proof mass 116 is at its maximum displacement over capacitance pad portion 118.

Capacitance will then decrease as proof mass 116 moves away from capacitance pad portion 118 until it is directly in between capacitance pad portions 118 and 122. At that time, both functions 214 and 216 are at zero-point 218, indicating that the capacitance is zero for both capacitance pad portions 118 and 122.

As proof mass 116 continues to move towards, and cover, capacitance pad portion 122, the capacitance will increase as shown on curve 216. When a single oscillation cycle of proof mass 116 is almost complete, the point at which proof mass 116 leaves capacitance pad portion 122 uncovered corresponds to inflection point 220, where the capacitance is zero for capacitance pad portion 122.

The discussion above relates to the case in which no other force acts on proof mass 116 outside of the forced, harmonic oscillation. The case in which an outside inertial force acts on proof mass 116 will be further described with reference to FIG. 3.

Figure 3:
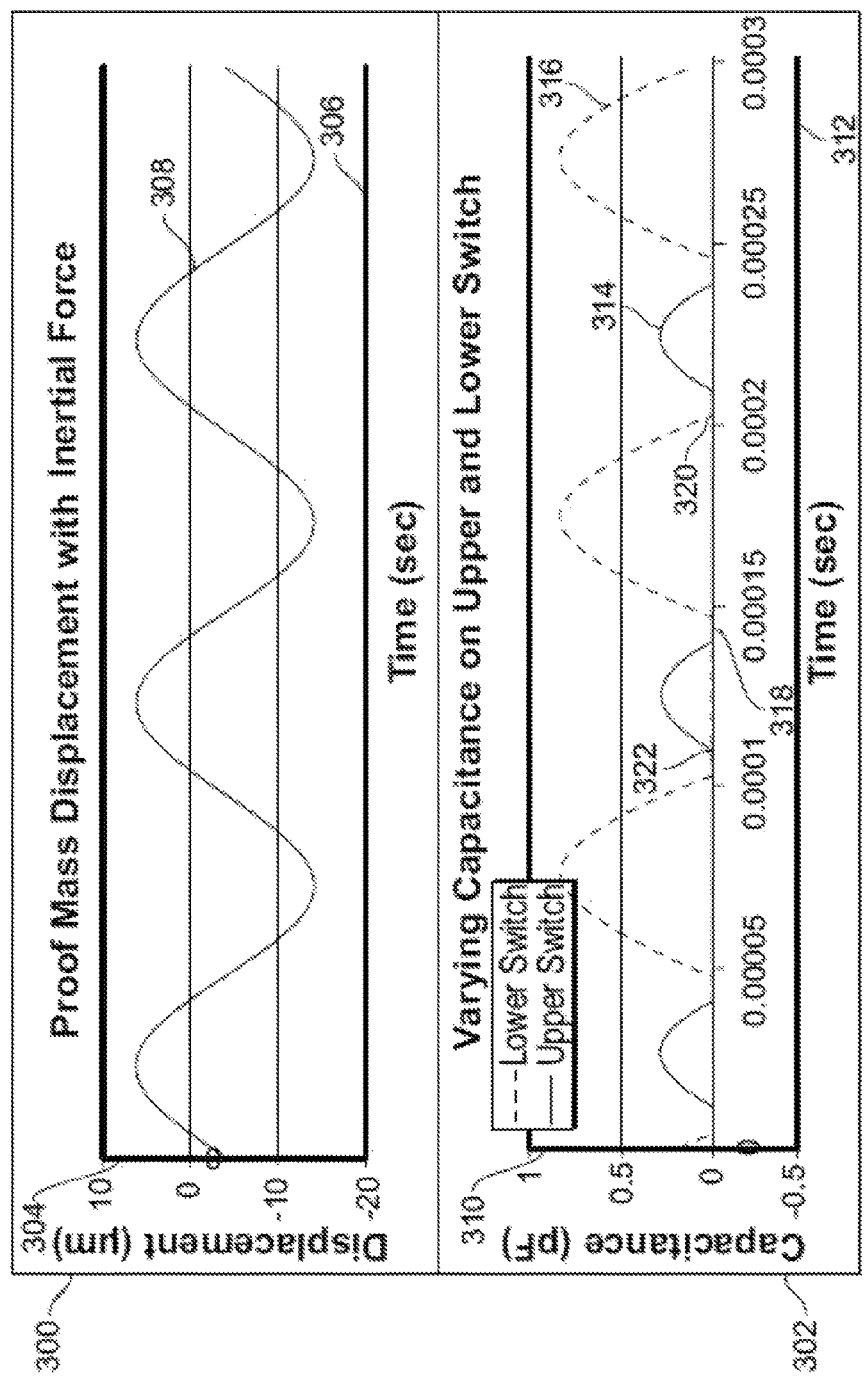
FIG. 3 illustrates a graphical representation of another embodiment of a TDSICS.

FIG. 3 illustrates a graphical representation of the operation of another embodiment of TDSICS 100.

As shown in the figure, a graph 300 includes a y-axis 304, an x-axis 306, and a function 308. A graph 302 includes ay-axis 310, an x-axis 312, a function 314, and a function 316. Functions 314 and 316 further include zero value areas, an example of which is labeled as zero-point area 318. Function 314 further includes inflection points, an example of which is labeled as an inflection point 322. Function 316 further includes inflection points, an example of which is labeled as inflection point 320.

With reference to FIG. 1, after the operation of TDSICS 100 starts with a forced harmonic oscillation of proof mass 116, an outside inertial force may be applied to TDSICS 100, which can affect the oscillation of proof mass 116. The inertial force may bias proof mass 116 toward either of capacitance pad portions 118 or 122, but for purposes of discussion, in this case the inertial force applied to TDSICS 100 biases proof mass 116 toward capacitance pad portion 122.

Returning to FIG. 3, y-axis 304 represents the displacement of proof mass 116 as it oscillates and x-axis 306 represents the elapsed time. Function 308 represents the displacement of proof mass 116 over time after the forced, harmonic oscillation begins. At zero displacement, proof mass 116 is directly between capacitance pad portions 118 and 122. With the inertial force applied to proof mass 116 that biases proof mass 116 toward capacitance pad portion 122, displacement in the direction of capacitance pad portion 122 is greater than displacement in the direction of capacitance pad portion 118.

Y-axis 310 represents the capacitance created with each of capacitance pad portions 118 and 122 as proof mass 116 oscillates between them, and x-axis 312 represents the elapsed time.

When proof mass 116 just begins to cover capacitance pad portion 118, function 314 is at inflection point 322 and the capacitance begins to increase. As proof mass continues to cover capacitance pad portion 118, the capacitance continues to increase until the capacitance reaches a maximum when proof mass 116 is at its maximum displacement over capacitance pad portion 118.

Capacitance will then decrease as proof mass 116 moves away from capacitance pad portion 118 until it is directly in between capacitance pad portions 118 and 122. At that time, both functions 314 and 316 are at zero-point 318, indicating that the capacitance is zero for both capacitance pad portions 118 and 122.

As proof mass 116 continues to move towards, and cover, capacitance pad portion 122, the capacitance will increase as shown on curve 316. Because an outside inertial force biased proof mass 116 toward capacitance pad portion 122, proof mass 116 will travel further toward capacitance pad portion 122 than it will toward capacitance pad portion 118. Proof mass 116 will therefore cover capacitance pad portion 118 for a shorter period of time than it will cover capacitance pad portion 122, and thus the relationship between proof mass 116 and capacitance pad portion 122 will create a higher maximum capacitance than that between proof mass 116 and capacitance pad portion 118, as shown by comparing function 314 to function 316. When a single oscillation cycle of proof mass 116 is almost complete, the point at which proof mass 116 leaves capacitance pad portion 122 uncovered corresponds to inflection point 320, where the capacitance is zero for capacitance pad portion 122.

Converting the current through TDSICS 100 to a voltage requires passing it through a resistive load, which creates a resistor-capacitor (RC) time constant which will interfere with the time interval measurement. If the capacitor switch was used as the top capacitor of a capacitor voltage divider, as will be described later with reference to FIG. 4, a voltage wave form identical to the change in capacitance over time can be produced. However, the direct current (DC) offset of this waveform would be floating, making it difficult to establish consistent logic threshold voltages to create the triggering event. Aspects of the present invention provide a logic input circuit that will go low when the capacitive switch capacitance is zero and go high when it is not zero.

Figure 4:
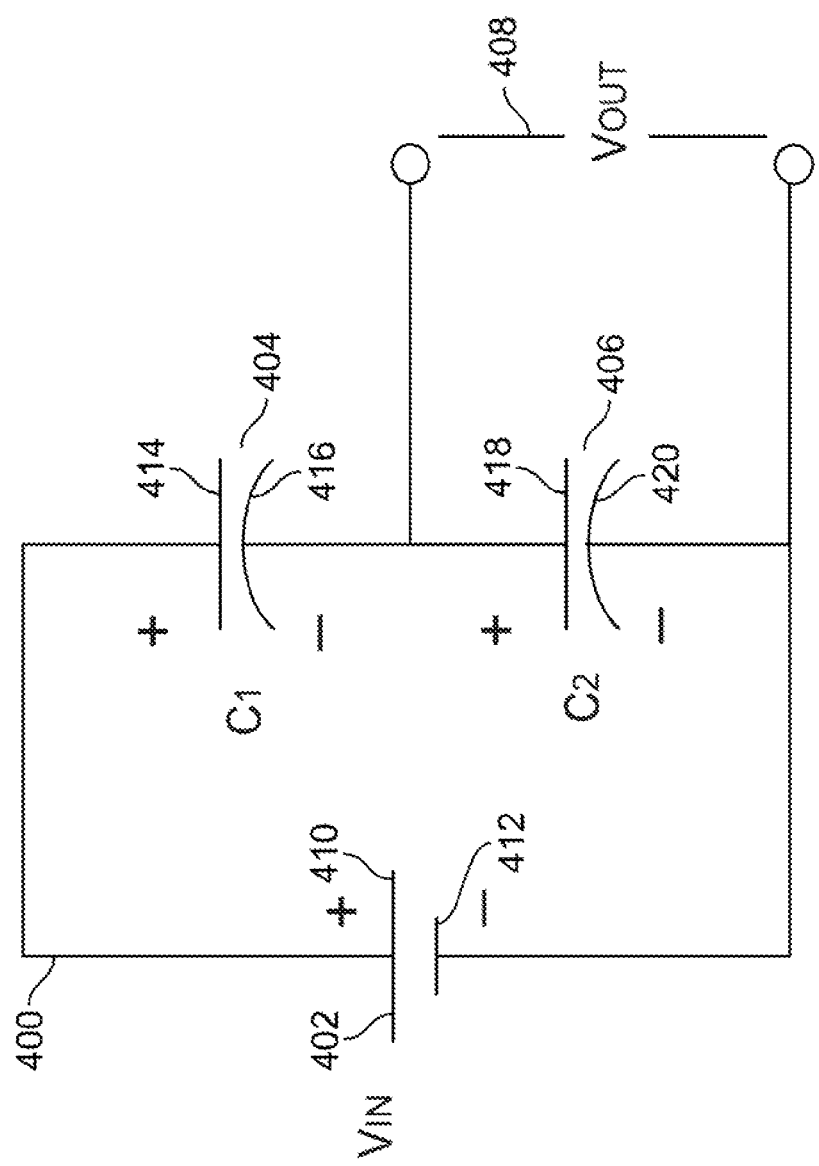
FIG. 4 illustrates a capacitive voltage divider.

FIG. 4 illustrates an embodiment of a capacitive voltage divider. The capacitive voltage divider (CVD) 400 shown in FIG. 4 includes an input voltage supply 402, a capacitor 404, a capacitor 406, and an output voltage $V_{out}$ 408. Input voltage supply 402 is a DC voltage with a positive terminal 410 and a negative terminal 412. Capacitor 404 is a variable capacitor with a positive terminal 414 and a negative terminal 416. Capacitor 406 is a capacitor with a fixed capacitance and includes a positive terminal 418 and a negative terminal 420. In operation, because capacitor 406 has a fixed capacitance, CVD 400 provides output voltage $V_{out}$ 408 that varies in proportion to the variance of the capacitance of capacitor 404, where output voltage $V_{out}$ 408 is always less than input voltage supply 402.

The negative charge on negative terminal 416 must equal the positive charge on positive terminal 418. The charge on a capacitor is the product of its capacitance and the voltage across it (q=CV). As such, if the capacitance of capacitor 404 changes, it changes the charge on negative terminal 416, which instantaneously changes the charge on positive terminal 418, which will then change the output voltage $V_{out}$ 408. If the capacitance of capacitor 404 changes periodically, then the DC bias of the output voltage $V_{out}$ 408 will be such that the average of output voltage $V_{out}$ 408 over time is zero.

If the output of CVD 400 were provided directly into a logic inverter circuit, the inverter would trigger in the center of the waveform. This will be described in greater detail with reference to FIG. 5.

Figure 5:
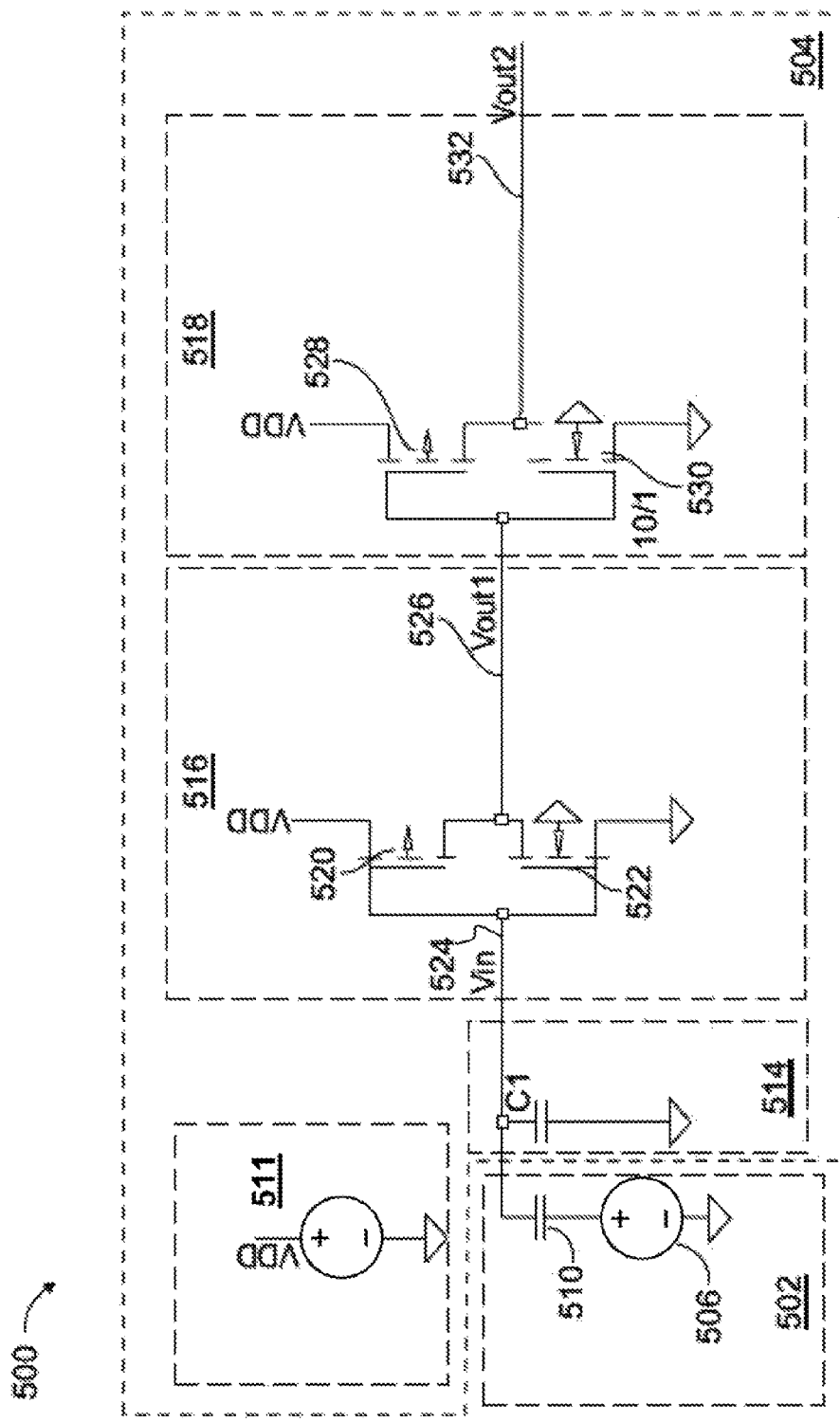
FIG. 5 illustrates a logic inverter circuit.

FIG. 5 illustrates an embodiment of a proximity switch circuit 500. The proximity switch circuit 500 shown in FIG. 5 includes a TDSICS portion 502 and a logic inverter circuit 504. TDSICS portion 502 includes an input voltage supply 506 and a TDSICS 510. TDSICS 510 is similar in structure to TDSICS 100 from FIG. 1, but for purposes of brevity, only one of the two capacitors created by the moving proof mass, TDSICS 510, will be discussed with reference to FIG. 5.

Logic inverter circuit 504 includes a first voltage supply 511, a capacitor 514, a logic inverter circuit switch 516, and a logic inverter circuit switch 518. The first voltage supply 511 supplies a voltage $V_{DD}$ 512 to the logic inverter circuit switches 516 and 518. Logic inverter circuit switch 516 includes a p-MOS field effect transistor (FET) 520, an n-MOS FET 522, and an output voltage $V_{out1}$ 526. Logic inverter circuit switch 518 includes a p-MOS FET 528, an n-MOS FET 530, and an output voltage $V_{out2}$ 532.

Logic inverter circuit switch 516 outputs $V_{out1}$ 526 as a digital high signal when logic inverter circuit switch 516 is in a first state and outputs $V_{out1}$ 526 as a digital low signal when logic inverter circuit switch 516 is in a second state. Logic inverter circuit switch 516 operates in the first state when an input voltage $V_{in}$ 524, is greater than or equal to a predetermined threshold voltage, $V_{th}$.

P-MOS field effect transistor (FET) 520 is operable and arranged to output $V_{out1}$ 526 when inverter circuit switch 516 is in a first state. N-MOS FET 530 is operable and arranged to output $V_{out1}$ 526 when inverter circuit switch 516 is in a second state.

In operation, TDSICS 510 and capacitor 514 are arranged as a capacitive voltage divider similar to the one shown in FIG. 4. TDSICS 510 has a variable capacitance as the proof mass moves, and capacitor 514 has a fixed capacitance. The output voltage from this capacitive voltage divider serves as the input voltage, $V_{in}$ 524, for logic inverter circuit switch 516.

When $V_{in}$ 524 is positive, or above a predetermined threshold, p-MOS FET 520 provides a positive output. When $V_{in}$ 524 is negative, or below the predetermined threshold, n-MOS FET 522 provides a positive output.

Logic inverter circuit switch 516 then inverts $V_{in}$ 524 to create $V_{out1}$ 526, which serves as the input voltage for logic inverter circuit switch 518. Logic inverter circuit switch 518 then inverts $V_{out1}$ 526 to create $V_{out2}$ 532.

When $V_{out1}$ 526 is positive, or above a predetermined threshold, p-MOS FET 528 provides a positive output. When $V_{out1}$ 526 is negative, or below the predetermined threshold, n-MOS FET 530 provides a positive output.

The double inversion serves to provide a crisp digital output signal, as will be further discussed with reference to FIG. 6. Issues can arise when using proximity switch circuit 500 because there can be a time delay between inflection points in $V_{in}$ 524 and inflection points in $V_{out1}$ 526 and $V_{out2}$ 532. This issue will be further discussed with reference to FIG. 6.

Figure 6:
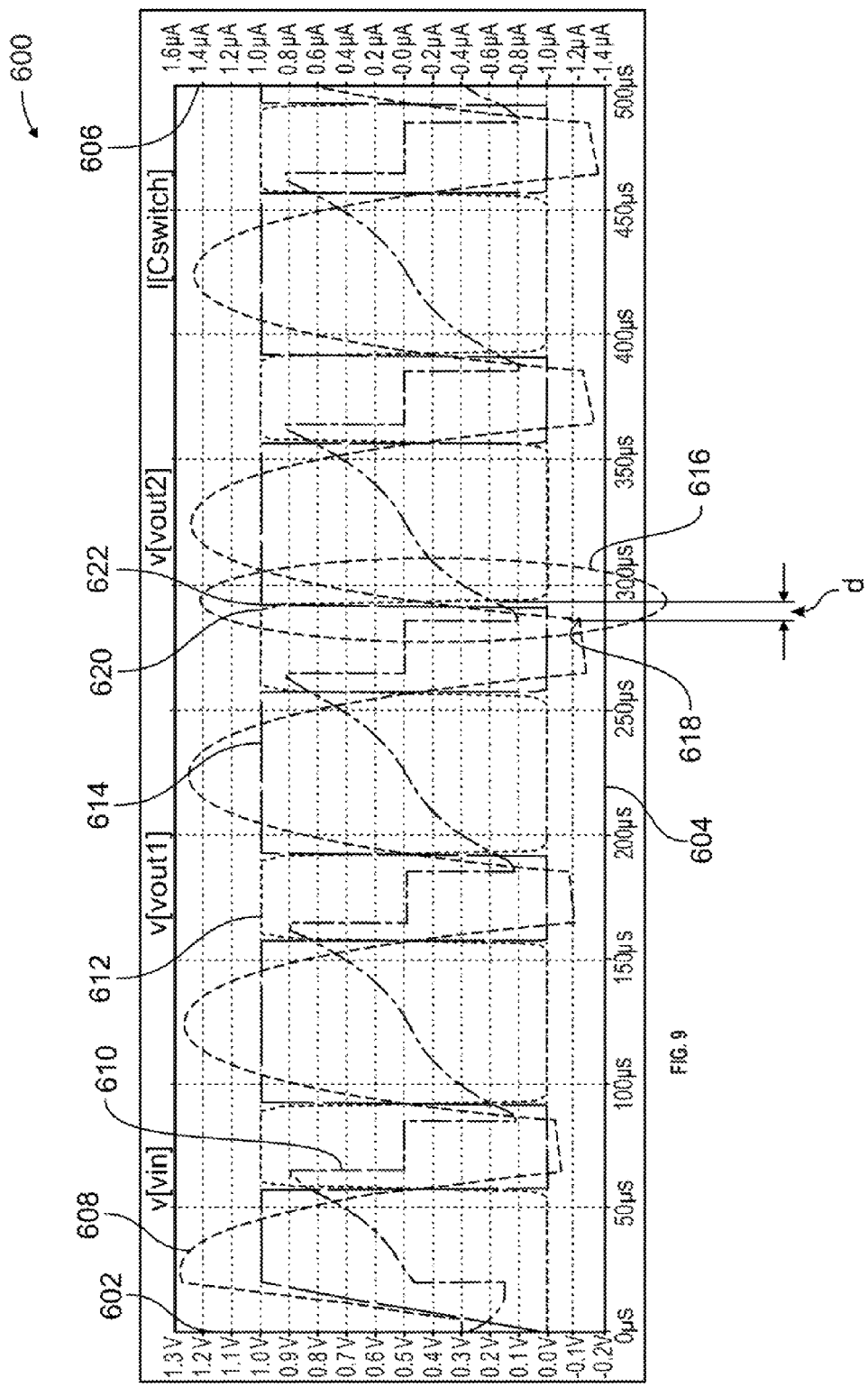
FIG. 6 illustrates a graphical representation of a logic inverter circuit.

FIG. 6 illustrates a graphical representation of proximity switch circuit 500 from FIG. 5.

As shown in the figure, a graph 600 includes a y-axis 602, an x-axis 604, a y-axis 606, a $V_{in}$ function 608, a current function 610, a first inverter stage $V_{out1}$ function 612, a second inverter stage $V_{out2}$ function 614 and a dotted ellipse 616. $V_{in}$ function 608 includes a plurality of inflection points, a sample of which is labeled as an inflection point 618. First inverter stage $V_{out1}$ function 612 includes a plurality of inflection points, a sample of which is labeled as an inflection point 620. Second inverter stage $V_{out2}$ function 614 includes a plurality of inflection points, a sample of which is labeled as an inflection point 622. Functions 612, 614, and 608 intersect at a plurality of intersection areas, a sample of which is within dotted ellipse 616.

Y-axis 602 represents the voltage measured at different points of proximity switch circuit 500 from FIG. 5. Y-axis 606 represents the current flowing through TDSICS 510 from FIG. 5, and x-axis 604 represents the elapsed time.

$V_{in}$ function 608 represents $V_{in}$ 524, first inverter stage $V_{out1}$ function 612 represents $V_{out1}$ 526, second inverter stage $V_{out2}$ function 614 represents $V_{out2}$ 532, and current function 610 represents the current I flowing through TDSICS 510.

As the current flows through logic inverter circuit switch 516, $V_{out1}$ 526 goes to zero when $V_{in}$ 524 is at its maximum and $V_{out1}$ 526 goes to its maximum when $V_{in}$ 524 is at its minimum, as shown by first inverter stage $V_{out1}$ function 612.

As the current continues to flow through logic inverter circuit switch 518, $V_{out2}$ 532 goes to its maximum when $V_{in}$ 524 is at its maximum, and $V_{out2}$ 532 goes to zero when $V_{in}$ 524 is at its minimum, as shown by second inverter stage $V_{out2}$ function 614. As a result, first inverter stage $V_{out1}$ function 612 and second inverter stage $V_{out2}$ function 614 will always be 180 degrees out of phase with each other.

Inflection point 620 is curved, indicating a gradual change. Logic inverter circuit switch 516 provides an inverted digital output in response to an analog input. The switching time of logic inverter circuit switch 516 is not ideal, thus leading to a somewhat curved transition as shown by inflection point 620.

Logic inverter circuit switch 518 provides an inverted digital output in response to the digital output as provided by logic inverter circuit switch 516. Because logic inverter circuit switch 518 is working with a digital input, the output of logic inverter switch 518 is much cleaner. This is evident in inflection point 622, which is not curved, indicating a more instantaneous change.

For purposes of discussion, consider the situation when $V_{in}$ function 608 corresponds to proof mass 116 oscillating over capacitance pad portion 118. As mentioned above, when proof mass 116 is not over capacitance pad portion 118, $V_{in}$ function 608 is not at a minimum.

Therefore, when $V_{in}$ function 608 starts to rise from a minimum, proof mass 116 is starting to move over capacitance pad portion 118. The purpose of proximity switch circuit 500 is to determine when proof mass 116 moves over capacitance pad portion 118. However, proximity switch circuit 500 has an inherent delay in determining when proof mass 116 moves is starting to move over capacitance pad portion 118.

As shown at dotted ellipse 616, at inflection point 618, $V_{in}$ 524 is no longer at a minimum and is beginning to rise toward its maximum. For the circuit to be as accurate as possible, first inverter stage $V_{out1}$ function 612 and second inverter stage $V_{out2}$ function 614 would invert at the instant $V_{in}$ 524 reaches inflection point 618. However, first inverter stage $V_{out1}$ function 612 and second inverter stage $V_{out2}$ function 614 do not invert until a time delay, d, after $V_{in}$ 524 reaches inflection point 618, at the intersection within dotted ellipse 616.

Proximity switch circuit 500 may be improved to reduce or eliminate the time delay d, in order to increase speed and accuracy. For example, a transistor may be used to bias the input of an inverter being supplied from a voltage divider that includes a TDSICS. The biasing transistor may be driven in a feedback manner from the output of the inverter. By biasing the inverter, as soon as the voltage changes by a minimal amount at the input of the inverter, the gate of the inverter is actuated. In this manner, delay of the output of the logic inverter circuits is drastically reduced or eliminated.

The proximity switch circuit described herein comprises, consists of, or consists essentially of a proximity switch comprising a variable capacitor, a capacitive voltage divider, and modified inverter logic circuits. At a specific location (proximity) of the moving part of the variable capacitor, the variable capacitor's capacitance goes from approximately zero to a non-zero value, and returns to approximately zero when the moving part passes the same location going in the opposite direction. As used herein the phrase "approximately zero" means a baseline capacitance of the circuit. The variable capacitor is the top capacitor of the capacitive voltage divider, with the bottom capacitor's capacitance chosen to be of the same order of magnitude as the maximum capacitance of the variable capacitor.

A DC voltage applied to the top of the voltage divider is designed to provide enough charge swing to switch the logic circuit without creating excessive capacitive forces on the variable capacitor. Further, the value of the capacitance of the lower capacitor is designed to be much greater than the input gate capacitance of the inverters, to minimize the effect of the gate capacitance changing at different logic states.

The output of the first inverter controls a transistor that sets the input voltage of the first inverter just below the switching voltage when the output is high. This transistor is turned off when the output is low, allowing the input voltage to increase with increasing charge on the capacitors. A second voltage $V_{cc}$ is chosen such that the initial charge accumulation on the capacitors causes the inverter to switch to a low output. Thus the waveform generated by the charge build-up on the capacitors has $V_{cc}$ as its lowest voltage. The output of the modified inverter is then sent to a second inverter to insure a maximum high output state and create a consistent load (fan-out) for the first inverter.

An embodiment of the proximity switch circuit will now be further described with reference to FIGS. 7-9.

Figure 7:
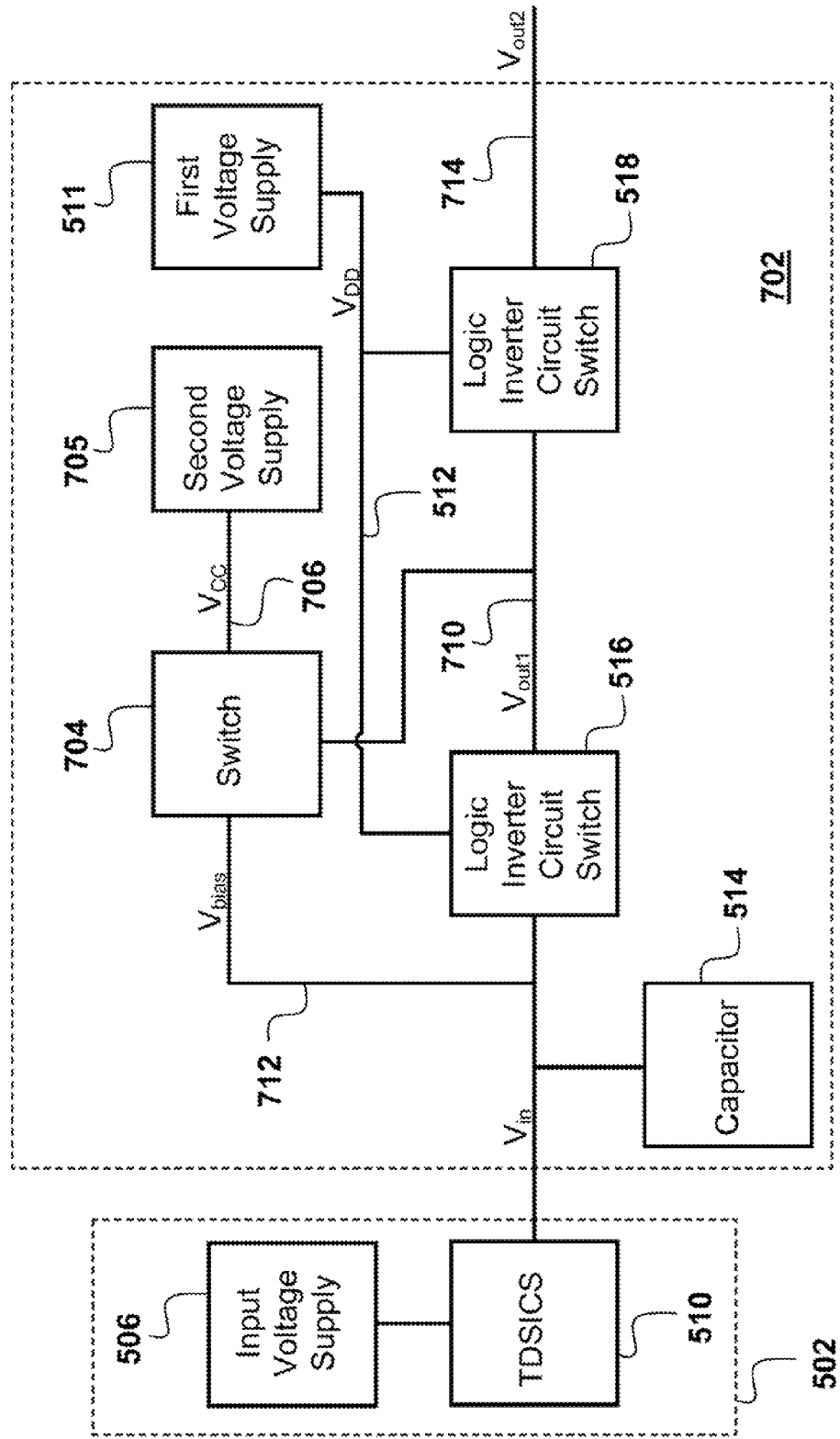
FIG. 7 illustrates a block diagram of a proximity switch circuit in accordance with aspects of the present invention.

FIG. 7 illustrates a block diagram of a proximity switch circuit 700 that comprises the TDSICS portion 502, and a logic inverter circuit 702. Logic inverter circuit 702 includes the first voltage supply 511, capacitor 514, logic inverter circuit switch 516, logic inverter circuit switch 518, a switch 704, and a second voltage supply 705. The TDSICS portion 502 includes the input voltage supply 506 and the TDSICS 510. The first voltage supply 511 supplies the voltage $V_{DD}$ 512 to the logic inverter circuit switches 516 and 518. The capacitor 514 and the TDSICS portion 502 output an input voltage $V_{in}$ 708. The logic inverter circuit switch 516 outputs an output voltage $V_{out1}$ 710. The switch 704 outputs a bias voltage $V_{bias}$ 712. The logic inverter circuit switch 518 outputs an output voltage $V_{out2}$ 714. The second voltage supply 705 outputs a second voltage $V_{CC}$ 706.

Switch 704 may be a conventional transistor, but it may also be any other device or system that provides bias voltage $V_{bias}$ 712 based on output voltage $V_{out1}$ 710. The second voltage $V_{CC}$ 706 serves as an input voltage to switch 704.

In operation, the combination of TDSICS 510 and capacitor 514 are arranged as a capacitive voltage divider similar to the one shown in FIG. 4. The voltage from the voltage divider, $V_{in}$ 708, is the input voltage to logic inverter circuit switch 516, which inverts the input signal and outputs voltage $V_{out1}$ 710. $V_{out1}$ 710 is an input voltage for both switch 704 and logic inverter circuit switch 518. Logic inverter circuit switch 518 inverts the input signal again and outputs voltage $V_{out2}$ 714. Switch 704 outputs bias voltage $V_{bias}$ 712, which forces input voltage $V_{in}$ 708 to be slightly lower than the second voltage $V_{CC}$ 706. The configuration of proximity switch circuit 700 eliminates the time delay described in FIG. 6. An example embodiment will be further described with reference to FIGS. 8-9.

Figure 8:
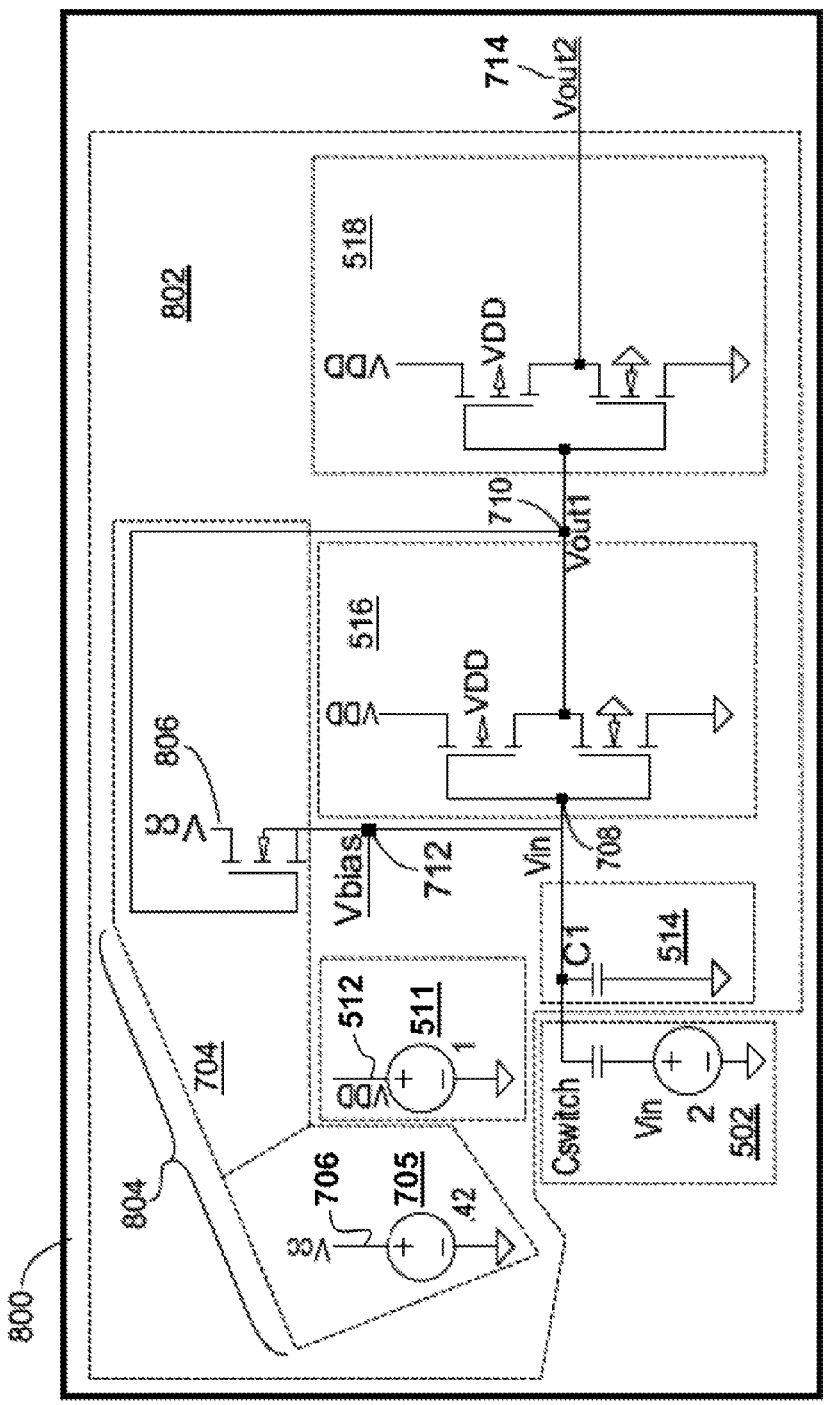
FIG. 8 illustrates an example of a logic inverter circuit in accordance with aspects of the present invention.

FIG. 8 illustrates an example proximity switch circuit 800 in accordance with aspects of the present invention.

As shown in the figure, proximity switch circuit 800 includes TDSICS portion 502 and a logic inverter circuit 802. Logic inverter circuit 802 includes the components of logic inverter circuit 504 and a bias circuit 804 with input voltage $V_{in}$ 708, output voltage $V_{out}$ 710, output voltage $V_{out2}$ 714, and bias voltage $V_{bias}$ 712. Bias circuit 804 includes switch 704 and the second voltage supply 705, which outputs the second voltage $V_{CC}$ 706. In this example embodiment, switch 704 is a FET 806.

TDSICS portion 502 operates in the same manner as described with reference to FIG. 5. In addition, $V_{DD}$ 512, capacitor 514, logic inverter circuit switch 516, and logic inverter circuit switch 518 function in the same manner as described with reference to FIG. 5.

The difference between proximity switch circuit 800 and proximity switch circuit 500 of FIG. 5 is the addition of bias circuit 804, which is connected in parallel with logic inverter circuit switch 516. The operation and advantages of proximity switch circuit 800 will be further described with reference to FIG. 9.

Figure 9:
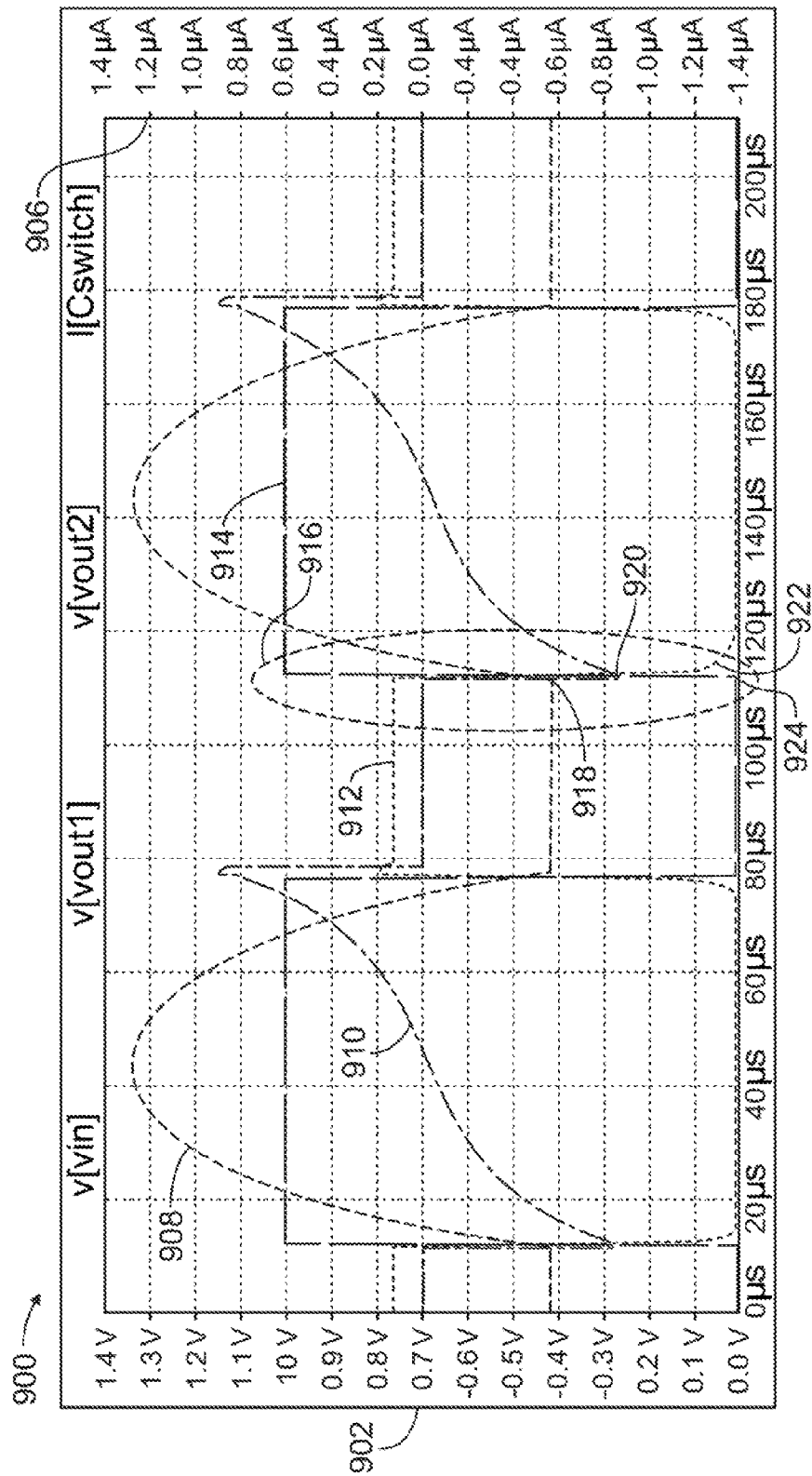
FIG. 9 illustrates a graphical representation of a proximity switch circuit in accordance with aspects of the present invention.

FIG. 9 illustrates a graphical representation of proximity switch circuit 800 in accordance with aspects of the present invention.

As shown in the figure, a graph 900 includes a y-axis 902, an x-axis 904, a y-axis 906, a $V_{in}$ function 908, a current function 910, a first inverter stage $V_{out1}$ function 912, a second inverter stage $V_{out2}$ function 914 and a dotted ellipse 916. $V_{in}$ function 908 has a plurality of inflection points, a sample of which is labeled as an inflection point 918. Current function 910 has a plurality of inflection points, a sample of which is labeled as an inflection point 920. First inverter stage $V_{out1}$ function 912 has a plurality of inflection points, a sample of which is labeled as an inflection point 922. Second inverter stage $V_{out2}$ function 914 has a plurality of inflection points, a sample of which is labeled as an inflection point 924.

Y-axis 902 represents the voltage measured at different points of proximity switch circuit 800 from FIG. 8. Y-axis 906 represents the current flowing through TDSICS 510, and x-axis 604 represents the elapsed time.

$V_{in}$ function 908 represents $V_{in}$ 708, first inverter stage $V_{out1}$ function 912 represents $V_{out}$ 710, second inverter stage $V_{out2}$ function 914 represents $V_{out2}$ 714, and current function 910 represents the current I flowing through TDSICS 510.

Returning to FIG. 8, as the current flows through logic inverter circuit switch 516, $V_{out1}$ 710 is fed back into switch 806. Switch 806 then outputs $V_{bias}$ 712 based on $V_{out1}$ 710. The purpose of $V_{bias}$ 712 is to force $V_{in}$ 708 to be very close to $V_{DD}$ 512 while remaining at a voltage just below that of $V_{DD}$ 512. The result is that, at the instant when the proof mass of TDSICS 510 begins to cover an electrode and causes a change in voltage, the signal goes through the double inversion of logic inverter circuit switch 516 and logic inverter circuit switch 518. This reaction serves to greatly reduce, or even eliminate, the time delay discussed with reference to FIGS. 5-6.

Referring back to FIG. 9, inflection point 918 shows the instant when the proof mass begins to cover an electrode, and $V_{in}$ 708 changes from its minimum value to an upward sloping curve as shown by $V_{in}$ function 908. At that same moment, $V_{out1}$ 710 reaches inflection point 920 and changes from its high value to zero. Additionally, at that same moment, $V_{out2}$ 714 reaches inflection point 922 and changes from zero to its high value.

For purposes of discussion, consider the situation when $V_{in}$ function 908 corresponds to proof mass 116 oscillating over capacitance pad portion 118. As mentioned above, when proof mass 116 is not over capacitance pad portion 118, $V_{in}$ function 908 is not at a minimum.

Therefore, when $V_{in}$ function 908 starts to rise from a minimum, proof mass 116 is starting to move over capacitance pad portion 118. The purpose of proximity switch circuit 800 is to determine when proof mass 116 moves over capacitance pad portion 118. In accordance with aspects of the present invention, proximity switch circuit 800 has very little, or no, delay in determining when proof mass 116 starts to move over capacitance pad portion 118.

As shown at dotted ellipse 916, at inflection point 918, $V_{in}$ 524 is no longer at a minimum and is beginning to rise toward its maximum. As compared to the information within dotted ellipse 616 of FIG. 6, it is clear in dotted ellipse 916 that first inverter stage $V_{out1}$ function 912 and second inverter stage $V_{out2}$ function 914 invert almost instantaneously at inflection point 918.

In summary, the present invention provides a proximity switch circuit that includes a TDSICS, a capacitive voltage divider, at least one inversion circuit, and a switch that biases the first inversion circuit. Arranging the circuit in the manner described above eliminates the time delay inherent in inversion circuits that do not include a switch. Eliminating the time delay by incorporating a proximity switch circuit serves to increase the accuracy of the sensor.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A proximity switch circuit comprising:
   a DC voltage supply operable to provide a DC voltage,
   a time domain switched inertial capacitive sensor arranged to provide a thresholding variable capacitance based on the DC voltage;
   a capacitor;
   a second voltage supply operable to provide a voltage, $V_{DD}$;
   a logic inverter circuit having a logic inverter input and a logic inverter output, said logic inverter circuit being supplied with $V_{DD}$;
   a third voltage supply operable to provide a second voltage, $V_{CC}$; and
   a switch;
   wherein said time domain switched inertial capacitive sensor and said capacitor are arranged as a capacitive voltage divider between said DC voltage supply and said logic inverter circuit and so as to provide an input voltage $V_{in}$, based on the DC voltage, as an input signal to said logic inverter circuit,
   wherein said logic inverter circuit is operable to output an output voltage, $V_{out}$, based on the input signal,
   wherein said logic inverter circuit is operable to output $V_{out}$ as a digital high signal in a first state and a digital low signal in a second state,
   wherein said logic inverter circuit operates in the first state when the input signal is greater than or equal to a predetermined threshold voltage, $V_{th}$, and
   wherein said switch is arranged to provide a bias voltage, $V_{bias}$, to said logic inverter circuit based on $V_{out}$ such that the input signal is based on $V_{in}$ and $V_{bias}$.

2. The proximity switch circuit of claim 1,
   wherein said logic inverter circuit comprises a first logic inverter circuit switch and a second logic inverter circuit switch,
   wherein said first logic inverter circuit switch is operable and arranged to output $V_{out}$ when said logic inverter circuit is in the first state, and
   wherein said second logic inverter circuit switch is operable and arranged to output $V_{out}$ when said logic inverter circuit is in the second state.

3. The proximity switch circuit of claim 2,
   wherein one of said first logic inverter circuit switch and said second logic inverter circuit switch comprises a n-MOS field effect transistor, and
   wherein the other of said first logic inverter circuit switch and said second logic inverter circuit switch comprises a p-MOS field effect transistor.

4. The proximity switch circuit of claim 3, wherein said capacitor has a predetermined fixed capacitance.

5. The proximity switch circuit of claim 4, wherein said switch comprises a field effect transistor.

6. The proximity switch circuit of claim 5, further comprising:
   a second logic inverter circuit having a second logic inverter input and a second logic inverter output;

wherein said second logic inverter circuit is operable to output a second output voltage, $V_{out2}$, based on $V_{out}$, wherein said second logic inverter circuit is operable to output $V_{out2}$ as the digital low signal in a first $V_{out2}$ state and the digital high signal in a second $V_{out2}$ state.

7. The proximity switch circuit of claim 1, wherein said capacitor has a predetermined fixed capacitance.

8. The proximity switch circuit of claim 7, wherein said switch comprises a field effect transistor.

9. The proximity switch circuit of claim 8, further comprising:
 a second logic inverter circuit having a second logic inverter input and a second logic inverter output;
 wherein said second logic inverter circuit is operable to output a second output voltage, $V_{out2}$, based on $V_{out}$,
 wherein said second logic inverter circuit is operable to output $V_{out2}$ as the digital low signal in a first $V_{out2}$ state and the digital high signal in a second $V_{out2}$ state.

10. The proximity switch circuit of claim 1, wherein said switch comprises a field effect transistor.

11. The proximity switch circuit of claim 10, further comprising:
 a second logic inverter circuit having a second logic inverter input and a second logic inverter output;
 wherein said second logic inverter circuit is operable to output a second output voltage, $V_{out2}$, based on $V_{out}$,
 wherein said second logic inverter circuit is operable to output $V_{out2}$ as the digital low signal in a first $V_{out2}$ state and the digital high signal in a second $V_{out2}$ state.

12. The proximity switch circuit of claim 11, further comprising:
 a second logic inverter circuit having a second logic inverter input and a second logic inverter output;
 wherein said second logic inverter circuit is operable to output a second output voltage, $V_{out2}$, based on $V_{out}$,
 wherein said second logic inverter circuit is operable to output $V_{out2}$ as the digital low signal in a first $V_{out2}$ state and the digital high signal in a second $V_{out2}$ state.

13. A proximity switch circuit, for use with a DC voltage supply operable to provide an alternating driving voltage, and a time domain switched inertial capacitive sensor arranged to provide a thresholding variable capacitance based on the alternating driving voltage, said proximity switch circuit comprising:
 a capacitor;
 a second voltage supply operable to provide a voltage, $V_{DD}$;
 a logic inverter circuit having a logic inverter input and a logic inverter output, said logic inverter circuit being supplied with $V_{DD}$;
 a third voltage supply operable to provide a second voltage, $V_{CC}$; and
 a switch;
 wherein said capacitor is operable to be arranged with the time domain switched inertial capacitive sensor as a capacitive voltage divider between the DC voltage supply and said logic inverter circuit and so as to provide an input voltage $V_{in}$, based on the alternating driving voltage, as an input signal to said logic inverter circuit,
 wherein said logic inverter circuit is operable to output an output voltage, $V_{out}$, based on the input signal,
 wherein said logic inverter circuit is operable to output $V_{out}$ as a digital high signal in a first state and a digital low signal in a second state,
 wherein said logic inverter circuit operates in the first state when the input signal is greater than or equal to a predetermined threshold voltage, $V_{th}$, and
 wherein said switch is arranged to provide a bias voltage, $V_{bias}$, to said logic inverter circuit based on $V_{out}$ such that the input signal is based on $V_{in}$ and $V_{bias}$.

14. The proximity switch circuit of claim 13,
 wherein said logic inverter circuit comprises a first logic inverter circuit switch and a second logic inverter circuit switch,
 wherein said first logic inverter circuit switch is operable and arranged to output $V_{out}$ when said logic inverter circuit is in the first state, and
 wherein said second logic inverter circuit switch is operable and arranged to output $V_{out}$ when said logic inverter circuit is in the second state.

* * * * *